(12) United States Patent
Kim (10) Patent No.: US 11,796,605 B2
(45) Date of Patent: Oct. 24, 2023

(54) BATTERY CELL DIAGNOSTIC DEVICE AND METHOD

(71) Applicant: LG Energy Solution, Ltd., Seoul (KR)

(72) Inventor: Won Gon Kim, Daejeon (KR)

(73) Assignee: LG Energy Solution, Ltd.

( * ) Notice: Subject to any disclaimer, the term of this patent is extended or adjusted under 35 U.S.C. 154(b) by 33 days.

(21) Appl. No.: 17/608,264

(22) PCT Filed: Apr. 24, 2020

(86) PCT No.: PCT/KR2020/005425
§ 371 (c)(1),
(2) Date: Nov. 2, 2021

(87) PCT Pub. No.: WO2020/226308
PCT Pub. Date: Nov. 12, 2020

(65) Prior Publication Data
US 2022/0214405 A1    Jul. 7, 2022

(30) Foreign Application Priority Data

May 3, 2019    (KR) .................. 10-2019-0052154

(51) Int. Cl.
*G01R 31/00* (2006.01)
*G01R 31/396* (2019.01)
(Continued)

(52) U.S. Cl.
CPC ....... *G01R 31/396* (2019.01); *G01R 31/3842* (2019.01); *H01M 10/425* (2013.01);
(Continued)

(58) Field of Classification Search
USPC .......................................... 324/426, 432–435
See application file for complete search history.

(56) References Cited

U.S. PATENT DOCUMENTS

2010/0134069 A1    6/2010    Oosawa et al.
2010/0309949 A1    12/2010    Akaboshi et al.
(Continued)

FOREIGN PATENT DOCUMENTS

CN    106816905 A    6/2017
CN    108398646 A    8/2018
(Continued)

OTHER PUBLICATIONS

Extended European Search Report including Written Opinion for Application No. 20802564.3 dated May 3, 2022, pp. 1-9.
(Continued)

*Primary Examiner* — Vincent Q Nguyen
(74) *Attorney, Agent, or Firm* — Lerner David LLP (57) ABSTRACT

A device and method for diagnosing an increase in resistance of a lead unit of a battery cell, including a first voltage measurement step in which when a battery pack is in an open circuit voltage state, a voltage is measured for each unit cell of the battery pack, a second voltage measurement step in which, when the battery pack is in a charging or discharging state, a voltage is measured for each unit cell according to a predetermined current flowing through the battery pack, and a step for comparing, for each unit cell, a voltage measured in the first voltage measurement step and a voltage measured in the second voltage measurement step, and detecting whether the unit cell is abnormal.

14 Claims, 8 Drawing Sheets

(51) Int. Cl.

| | |
|---|---|
| *G01R 31/3842* | (2019.01) |
| *H01M 10/42* | (2006.01) |
| *H01M 10/48* | (2006.01) |
| *H02J 7/00* | (2006.01) |

(52) U.S. Cl.
CPC ......... *H01M 10/48* (2013.01); *H01M 10/482* (2013.01); *H02J 7/0047* (2013.01); *H01M 2010/4271* (2013.01)

(56) References Cited

U.S. PATENT DOCUMENTS

| | | |
|---|---|---|
| 2013/0088201 A1 | 4/2013 | Iwasawa et al. |
| 2013/0245970 A1 | 9/2013 | Zhang |
| 2013/0249317 A1 | 9/2013 | Kang et al. |
| 2016/0061909 A1 | 3/2016 | Iino et al. |
| 2016/0240833 A1 | 8/2016 | Yang et al. |
| 2016/0306014 A1 | 10/2016 | Jeon |
| 2017/0285112 A1 | 10/2017 | Dou et al. |
| 2019/0027776 A1* | 1/2019 | Kuroda ............... H01M 10/045 |
| 2019/0339335 A1 | 11/2019 | Kim et al. |
| 2020/0191874 A1 | 6/2020 | Malrieu |
| 2021/0318386 A1* | 10/2021 | Itakura ................. H01M 10/48 |

FOREIGN PATENT DOCUMENTS

| | | |
|---|---|---|
| CN | 108469589 A | 8/2018 |
| JP | 2000215923 A | 8/2000 |
| JP | 2002168928 A | 6/2002 |
| JP | 2003-070161 A | 3/2003 |
| JP | 2004014205 A | 1/2004 |
| JP | 2006138750 A | 6/2006 |
| JP | 3939071 B2 | 6/2007 |
| JP | 3988324 B2 | 10/2007 |
| JP | 2009-103706 A | 5/2009 |
| JP | 2010-127722 A | 6/2010 |
| JP | 4696291 B2 | 6/2011 |
| JP | 2015186266 A | 10/2015 |
| JP | 2016-096592 A | 5/2016 |
| KR | 100694486 B1 | 3/2007 |
| KR | 101279410 B1 | 6/2013 |
| KR | 20160012695 A | 2/2016 |
| KR | 20160091568 A | 8/2016 |
| KR | 20160123173 A | 10/2016 |
| KR | 20180079971 A | 7/2018 |
| WO | 2011132311 A1 | 10/2011 |
| WO | 2019042636 A1 | 3/2019 |

OTHER PUBLICATIONS

International Search Report for PCTKR2020005425 dated Aug. 5, 2020, 2 pgs.

* cited by examiner

BATTERY CELL DIAGNOSTIC DEVICE AND METHOD

CROSS-REFERENCE TO RELATED APPLICATIONS

The present application is a national phase entry under 35 U.S.C. § 371 of International Application No. PCT/KR2020/005425 filed Apr. 24, 2020, published in Korean, which claims priority from Korean Patent Application No. 10-2019-0052154, filed on May 3, 2019, in the Korean Intellectual Property Office, all of which are incorporated herein by reference.

TECHNICAL FIELD

The present invention relates to a device and method for diagnosing an increase in resistance of a lead unit of a battery cell.

BACKGROUND ART

Typically, when a plurality of unit cells are connected in series and/or parallel so as to form a high voltage battery, the resistance of lead units of both ends of a unit cell, which are contact units, increases due to corrosion or poor contact, etc., of the lead units.

When the resistance of the lead units increases in this way, degradation of the corresponding unit cell becomes accelerated due to heating of a part having the increased resistance upon charging and discharging the battery. In addition, due to a voltage applied to the corresponding resistance part, a measurement error occurs upon measuring a cell voltage. Furthermore, there is also an issue that the heating leads to ignition of the battery.

SUMMARY

Technical Problem

An aspect of the present invention provides a battery cell diagnostic device and method for rapidly diagnosing resistance of a lead unit of a unit cell upon charging and discharging a battery to raise stability of the battery, when the battery includes at least a plurality of unit cells connected in series.

Technical Solution

According to an aspect of the present invention, there is provided a battery cell diagnostic device including: a voltage sensor configured to measure a first voltage across each unit cell of a battery pack when the battery pack is in an open circuit voltage state, and a second voltage across each unit cell of the battery pack when the battery pack is in a charged or discharged state and a predetermined current is flowing through the battery pack; a current sensor configured to measure a current of the battery pack; and a controller configured to compare the first voltage with the second voltage, and detect whether any of the unit cells is abnormal based on the comparison.

The voltage measurement unit may include: a multiplexer including a plurality of measurement terminals respectively connected to leads between the unit cells and at both ends of the battery pack, and configured to output a measurement voltage from measurement terminals of both ends of one unit cell according to a preset measurement condition; and an analog-to-digital converter (ADC) configured to convert the measurement voltage output from the multiplexer.

For each of the unit cells, the controller may determine whether a voltage difference between the first voltage and the second voltage exceeds a predetermined reference value to detect whether the unit cell is abnormal. In response to the abnormality of the unit cell being detected, the controller may determine that resistance equal to or greater than a predetermined reference value is present in a part of the leads of both ends of the unit cell.

As an example, in response to the abnormality in the unit cell being detected, the controller may generate a notification signal for the unit cell.

In addition, the battery cell diagnostic device according to an embodiment of the present invention may further include a memory configured to store at least one between the first voltage and the second voltage.

The controller may be configured to determine whether the battery pack is in the open circuit voltage state or in the charged or discharged state based on the current measured by the current sensor According to another aspect of the present invention, there is provided a battery cell diagnostic method including: when a battery pack is in an open circuit voltage state, measuring a first voltage across each unit cell of the battery pack; when the battery pack is in a charging or discharging state and a predetermined current is flowing through the battery pack, measuring a voltage across each unit cell of the battery pack according to; comparing, for each unit cell, the first voltage and the second voltage; and detecting whether any of the unit cells is abnormal based on the comparison.

For each unit cell of the battery pack, detecting whether the unit cell is abnormal may include determining that a voltage difference between the first voltage and the second voltage exceeds a predetermined reference value. As an example, in response to the abnormality of the unit cell being detected, the method may include determining that resistance equal to or greater than a predetermined reference value is present between leads at respective ends of the unit cell.

The battery cell diagnostic method according to an embodiment of the present invention may further include generating a notification signal for the unit cell, in response to the abnormality of the unit cell being detected.

In addition, the present invention may be implemented with a battery pack. According to another aspect of the present invention, there is provided a battery pack including: a battery module including at least a plurality of unit cells connected in series; and a battery management system configured to control charging and discharging the battery module, wherein the battery management system may include: a voltage sensor configured to measure a first voltage across each of the unit cells when the battery pack is in an open circuit voltage state, and a second voltage across each unit cell of the battery pack when the battery pack is in a charged or discharged state and a predetermined current is flowing through the battery pack; a current sensor configured to measure a current of the battery module; and a controller configured to compare the first voltage with the second voltage, and to detect whether any of the unit cells is abnormal based on the comparison.

Advantageous Effects

According to the present invention, resistance of a lead unit of a unit cell upon charging and discharging a battery may be rapidly diagnosed to raise the stability of the battery.

The effects of the present invention will be additionally descried according to embodiments of the present invention.

DETAILED DESCRIPTION

Hereinafter, various embodiments of the present invention will be disclosed with reference to the accompanying drawings. However, the description is not intended to limit the present invention to particular embodiments, and it should be construed as including various modifications, equivalents, and/or alternatives according to the embodiments of the present invention. In regard to the description of the drawings, like reference numerals refer to like elements.

Terms defined in the present invention are used for only describing a specific exemplary embodiment and may not have an intention to limit the scope of other exemplary embodiments. As used herein, the singular forms "a," "an" and "the" are intended to include the plural forms as well, unless the context clearly indicates otherwise. Unless differently defined, entire terms including a technical term and a scientific term used here have the same meaning as a meaning that may be generally understood by a person of common skill in the art. The terms defined in a generally used dictionary should be interpreted as having meanings that are the same as or similar with the contextual meanings of the relevant technology and should not be interpreted as having ideal or exaggerated meanings unless they are clearly defined in the various exemplary embodiments. In some case, terms defined in the present invention cannot be analyzed to exclude the present exemplary embodiments.

In addition, in describing elements of embodiments of the present invention, terms such as first, second, A, B, (a), and (b) may be used. Such terms are used only for distinguishing an element from another element, but do not limit the substance of the element, sequence or order. It should be noted that if it is described in the specification that one element is "connected," "coupled" or "joined" to another element, a third component may be "connected," "coupled," and "joined" between the one element and the other component, although the one element may be directly connected, coupled or joined to the other element.

Figure 1:
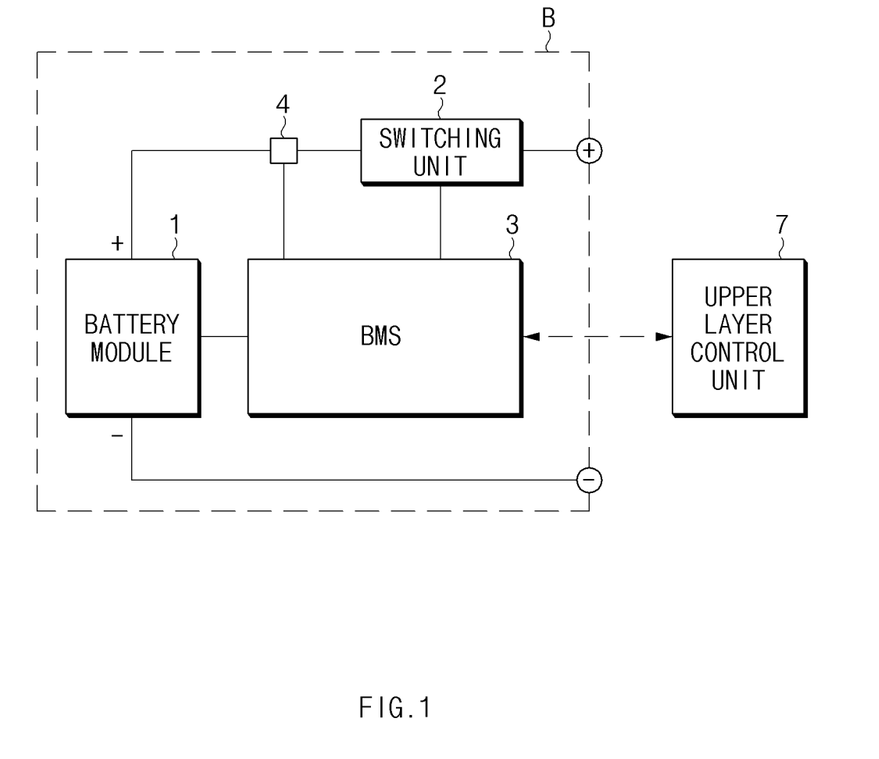
FIG. 1 is a block diagram schematically representing the configuration of a battery pack.

The configuration of a battery pack will be described with reference to FIG. 1. FIG. 1 is a block diagram schematically representing the configuration of the battery pack.

As shown in FIG. 1, a battery pack B is configured of one or more battery cells, and includes a battery module 1 that is chargeable and dischargeable, a switching unit 2 connected in series with an anode side or a cathode side of the battery module 1 and for controlling a charging/discharging current flow of the battery module 1, and a battery management system 3 (hereinafter, BMS) for monitoring a voltage, a current, a temperature, or the like of the battery pack B, and controlling and managing the battery pack B so as to prevent overcharging, over-discharging, and the like.

Here, the switching unit 2 is a mechanical switching element or a semiconductor switching element for controlling a current flow with respect to charging or discharging of the battery module 1, and, for example, at least one mechanical relay or a MOSFET may be employed.

In addition, the BMS 3 may be connected to the battery module 1 to receive data with respect to the voltage, current, or temperature so as to monitor the voltage, current, temperature, or the like of the battery pack B. In addition, for example, when the switching unit 2 is a semiconductor switching element, a voltage and a current of the gate, source, or drain terminal of the semiconductor switching element may be measured or calculated. In addition, the current, voltage, temperature, or the like of the battery module 1 may be measured using various types of sensors 4 provided adjacently to the semiconductor switching element. The BMS 3 may be an interface for receiving values obtained by measuring various parameters, and include a plurality of terminals, and a circuit or the like connected to the terminals and for processing the received values.

In addition, the BMS 3 may control turning ON/OFF of the switching unit 2, and be connected to the battery module 1 to monitor the state of the battery module 1.

In addition, the BMS 3 may be connected to an upper layer controller 7. The BMS 3 may transmit information about a state of and a control for the battery to the upper layer controller 7, or control an operation of the battery pack B on the basis of a control signal applied from the upper layer controller 7. The BMS 3 may transmit and receive various types of signals and data in a wired and/or wireless manner with the upper layer controller 7. Here, the battery pack B may be, for example, a vehicle battery pack, and the upper layer controller 7 may be a microcontroller unit (MCU) of a vehicle system. Alternatively, the battery pack B may be a battery pack of an energy storage system (ESS), but is not limited thereto.

A battery cell diagnostic device according to an embodiment of the present invention may be a component between the battery module 1 and the battery management system 3, or a part of the battery management system 3.

Figure 2:
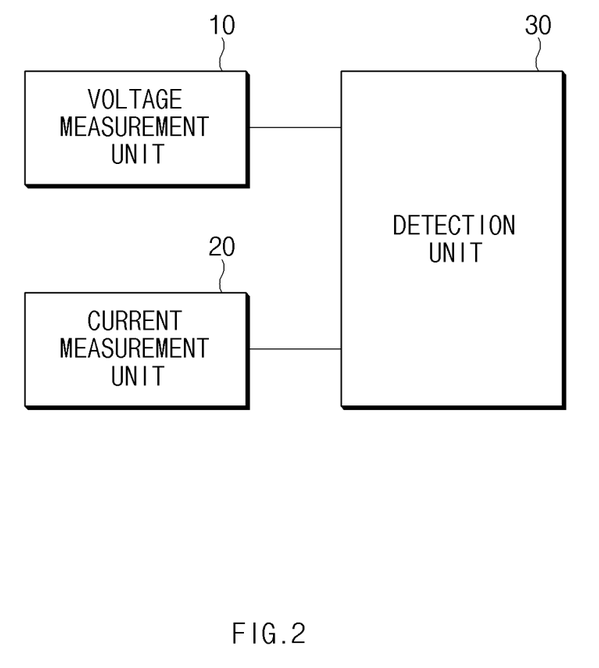
FIG. 2 is a block diagram for explaining the configuration of a battery cell diagnostic device.
Figure 3:
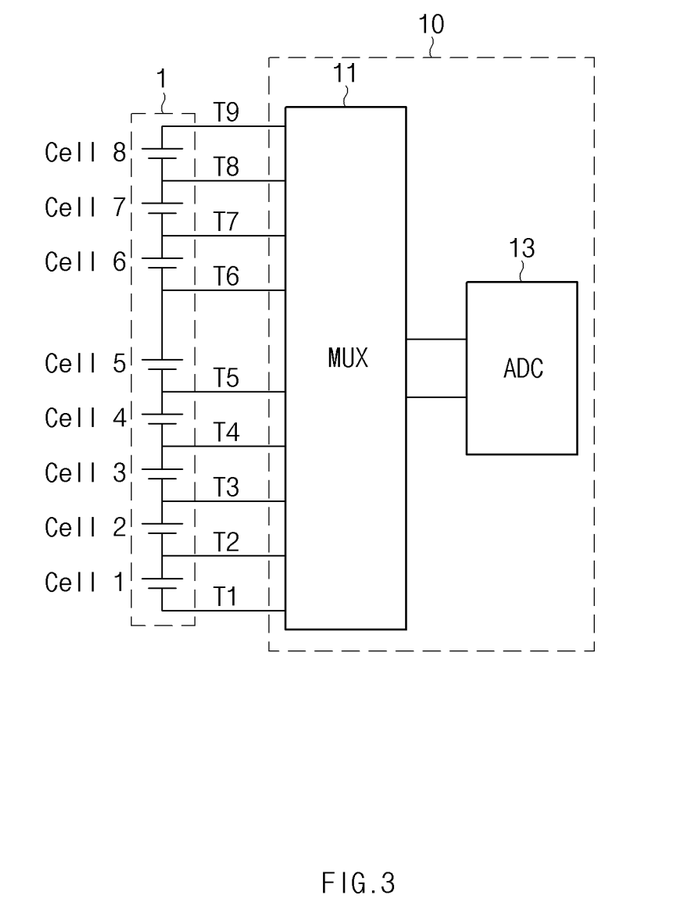
FIG. 3 is an exemplary diagram specifically representing the configuration of a voltage measurement unit of FIG. 2.

The battery cell diagnostic device according to an embodiment of the present invention will be described with reference to FIGS. 2 and 3. FIG. 2 is a block diagram for explaining the configuration of the battery cell diagnostic device; FIG. 3 is an exemplary diagram specifically representing the configuration of a voltage measurement unit of FIG. 2.

As illustrated in FIG. 2, the battery cell diagnostic device according to an embodiment of the present invention may be configured of a voltage measurement unit 10, a current measurement unit 20, and a detection unit 30.

The voltage measurement unit 10 is a component for measuring a voltage between both ends of each unit cell of a battery pack (namely, each unit cell of a plurality of unit cells connected in series in a battery module).

For example, as illustrated in FIG. 3, the voltage measurement unit 10 may be configured, for at least the plurality of unit cells Cell 1 to Cell 8 connected in series, of: a multiplexer 11 of which measurement terminals T1 to T9 are respectively connected to lead units of the unit cells and lead units of both outermost unit cells, and output measurement voltages from the measurement terminals of the both ends of one unit cell according to preset measurement conditions; and an ADC 13 for analog-to-digitally converting the measurement voltages from the multiplexer 11. Here, the preset measurement conditions may be set variously according to the measurement environment, and, for example, set to measure in order from Cell 1 to Cell 8 at a predetermined period.

The current measurement unit 20 is a component for measuring a current of the battery pack. For example, the current measurement unit 20 may be connected in series on a charging or discharging line, and measure a current amount when the battery pack is in a charged or discharged state. In this way, the technique for measuring a current amount of a battery pack in a charges or discharged state is well-known, and thus a detailed description thereabout will be omitted.

The detection unit 30 compares a first voltage measured for each unit cell when the battery pack is in an open circuit voltage state with a second voltage measured for each unit cell according to a predetermined current flowing through the battery pack, when the battery pack is in a charged or discharged state, and detects whether the unit cell is abnormal. In other words, the detection unit 30 compares, for each unit cell, a voltage when the battery pack is in an open circuit voltage state with a voltage in a charged or discharged state to determine whether to the unit cell is abnormal. Here, the first voltage in the open circuit voltage state is a reference value for comparison and may be measured once to be repeatedly used. To this end, the battery cell diagnostic device according to an embodiment of the present invention may further include a memory (not shown) for storing at least one among the first voltage and the second voltage.

The detection unit 30 determines, for each unit cell, whether a voltage difference between the first voltage and the second voltage exceeds a predetermined reference value to detect whether the unit cell is abnormal. According to this, when an abnormality of the unit cell is detected, the detection unit 30 may determine that resistance equal to or greater than a predetermined reference value is present in a part of the lead units of both ends of the unit cell. Furthermore, since the present invention determines an increase in resistance component through a voltage between both ends of each unit cell, even when not only the resistance present between the lead units of the both ends but internal resistance of each unit cell also increases, the abnormality of the unit cell may be detected. Accordingly, the abnormality in the resistance of the battery cell may be comprehensively diagnosed. In addition, as in the present invention, comparing voltage differences under a predetermined condition for each unit cell to detect the abnormality enables more accurate diagnosis than comparing voltage differences between unit cells. The reason is that the voltage difference in manufacturing design may preexist between unit cells.

Figure 4:
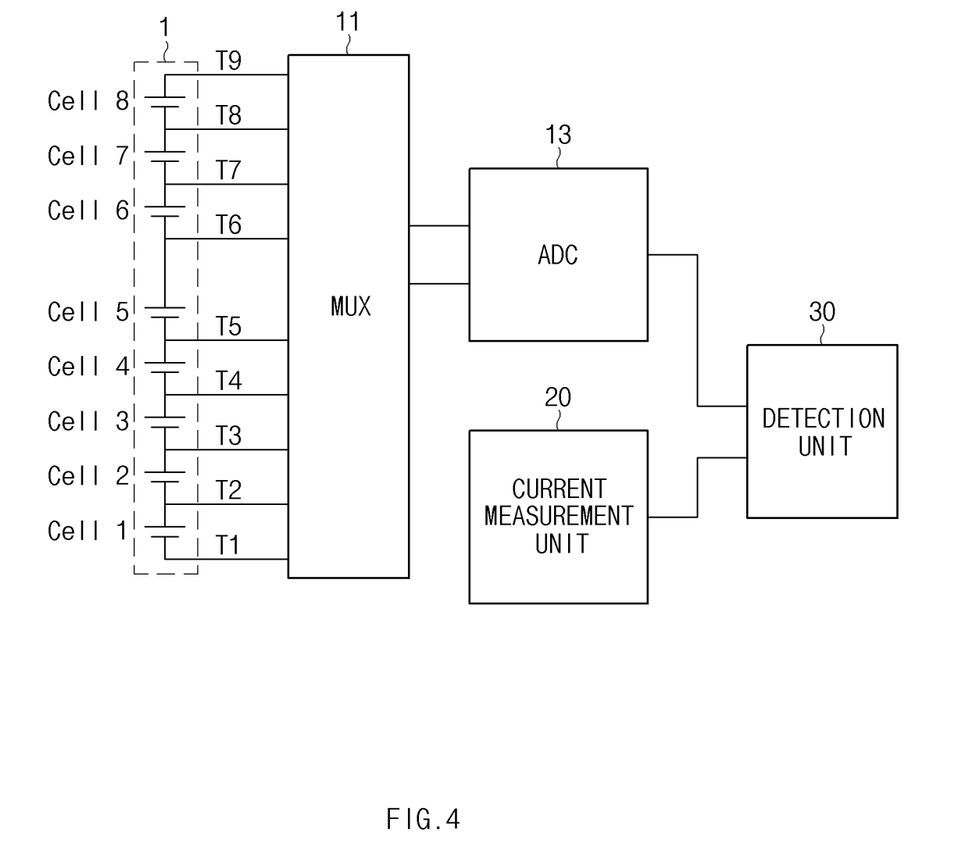
FIG. 4 is an exemplary diagram for explaining a case in which no lead resistance is present in a battery cell upon diagnosing the battery cell.

As an embodiment, a diagnostic process by the battery cell diagnostic device will be described with reference to FIGS. 4 and 5. FIG. 4 is an exemplary diagram for explaining a case in which no lead resistance is present in the battery cell upon diagnosing the battery cell, and FIG. 5 is an exemplary diagram for explaining a case in which the lead resistance is present in the battery cell upon diagnosing the battery cell.

Figure 5:
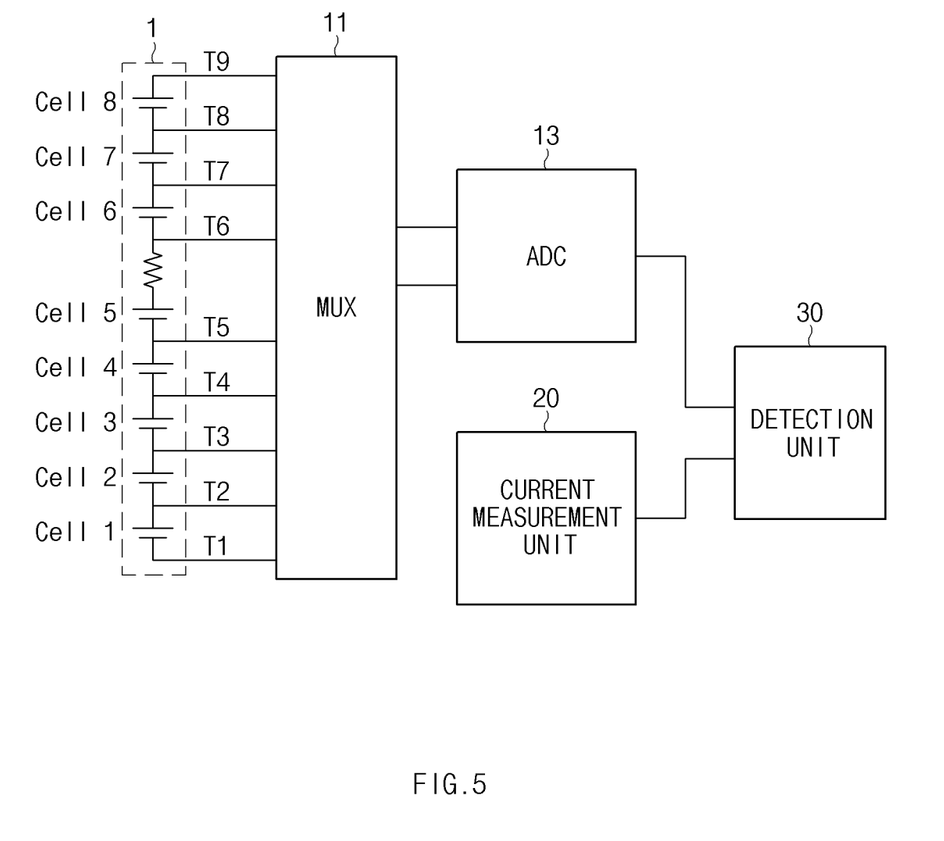
FIG. 5 is an exemplary diagram for explaining a case in which the lead resistance is present in the battery cell upon diagnosing the battery cell.

First, it is assumed that each unit cell of a battery pack is designed to have a voltage of 3V in FIGS. 4 and 5. As in FIG. 4, when the battery cell is assumed to scarcely have lead resistance, in case where there is no charging and discharging current, namely, the battery pack is in an open circuit voltage state, the voltage of each unit cell, which is measured by the multiplexer 11 and the ADC 12 of the voltage measurement unit may be approximately, for example, 3 V. Then, the battery discharging is performed to flow a current to the battery cell. Here, for example, the discharge current measured by the current measurement unit 20 is 100A, and the measurement voltage of each unit cell shows approximately 2.9 V. In this case, the voltage difference between the voltage measured in the open circuit voltage state for each unit cell and the voltage measured in a state of 100A discharging becomes approximately 0.1 V.

However, as shown in FIG. 5, when a resistance value, which is a magnitude not negligible as lead resistance, is assumed to be about, for example, 10 mΩ in, for example, a unit cell, Cell 5, the voltage of each unit cell, which is measured by the multiplexer 11 and the ADC 13 of the voltage measurement unit is still approximately 3 V, when the battery pack is in the open circuit voltage state. However, when battery discharging is performed thereafter and a current flows to the battery cell, the measurement voltage of each unit cell shows approximately 2.9 V when the discharge current measured by the current measurement unit 20 is 100A for unit cells Celli to Cell 4 and Cell 6 to Cell 8, but unit cell, Cell 5 shows approximately 3.9 V (namely, cell voltage 2.9 V+ lead resistance-applied voltage 1 V). Accordingly, when comparing voltage differences between a voltage for each unit cell, which is measured in the open circuit voltage state, and a voltage measured upon 100A discharging, the voltage difference is 0.1 V for unit cells Cell 1 to Cell 4 and Cell 6 to Cell 8, but is −0.9 V for unit cell, Cell 5. Accordingly, the detection unit 30 may determine that the resistance is present in the lead unit of unit cell, Cell 5.

In addition, when the abnormality is detected for a unit cell, the detection unit 30 may generate a notification signal for the corresponding unit cell. Thereby, the battery management system, for example, limits a charging/discharging operation of the battery upon generating the notification signal or transmits the notification signal to the upper layer controller or a manager's terminal to display a warning. Thus, when the abnormality occurs due to the resistance increase in the unit cell, an additional accident may be prevented in advance by rapidly treating the abnormality.

In this way, according to the present invention, the resistance of the lead unit of the unit cell may be rapidly diagnosed upon charging and discharging, and thus the stability of the battery may be raised.

Figure 6:
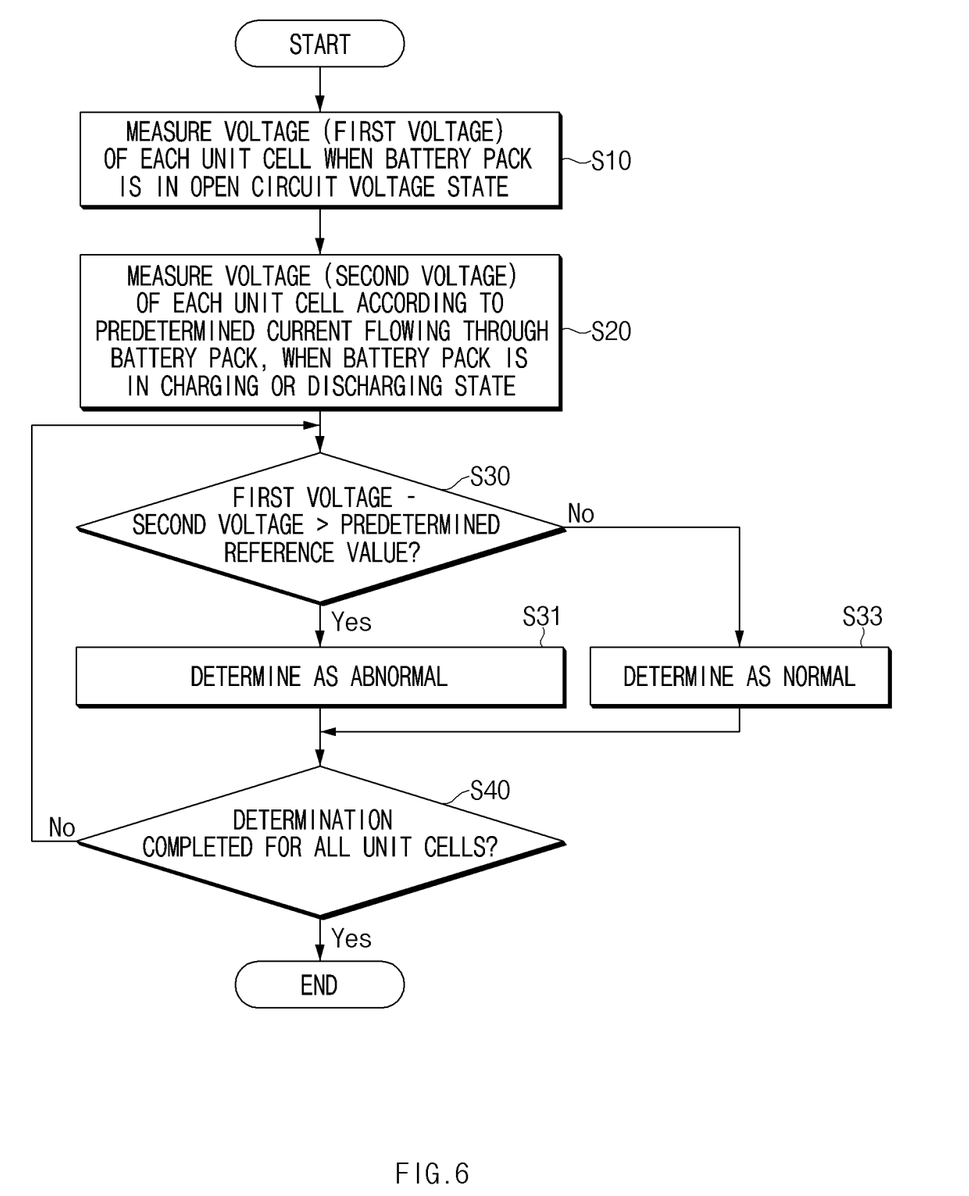
FIG. 6 is a flowchart representing a battery cell diagnostic method according to an embodiment of the present invention.

Next, the battery cell diagnostic method according to an embodiment of the present invention will be described with reference to FIG. 6. FIG. 6 is a flowchart showing a battery cell diagnostic method according to an embodiment of the present invention.

As shown in FIG. 6, the battery cell diagnostic method according to an embodiment of the present invention measures a voltage (namely, a first voltage) for each unit cell of the battery pack by means of a voltage measurement unit, when the batty pack is in an open circuit voltage state (operation S10). Next, when the battery pack is in a charged or discharged state, a voltage (namely, a second voltage) is measured for each unit cell according to a predetermined current flowing through the battery pack by means of the current measurement unit and the voltage measurement unit (operation S20). Then, the first voltage measured in operation S10 and the second voltage measured in operation S20 are compared for each unit cell (operation S30). For example, it is determined whether a voltage difference between the first voltage and the second voltage exceeds a predetermined reference value. In operation S30, when the voltage difference between the first voltage and the second voltage exceeds the predetermined reference value (Yes), the detection unit determines that the corresponding unit cell is abnormal (operation S31). When the abnormality of the unit cell is detected in this way, the resistance equal to or greater than a predetermined reference value may be determined to be present in a part of the lead units of both ends of the unit cell. In operation S30, when the voltage difference between the first voltage and the second voltage does not exceed the predetermined reference value (No), the detection unit determines that the corresponding unit cell is normal (namely, no abnormality) (operation S33). Next, the detection unit determines whether the abnormality determination is performed on all the unit cells (operation S40). When the abnormality determination is not completed for all the unit cells in operation 40 (No), the procedure moves to operation S30 again and determines whether the next cell is abnormal. When the abnormality determination is completed for all the unit cells in operation 40 (Yes), the monitoring procedure ends. Alternatively, when the abnormality determination is completed for all the unit cells in operation 40 (Yes), the determination unit may move to operation S10 or S20 according to a preset period and repeat a subsequent procedure.

In addition, the battery cell diagnostic method according to an embodiment of the present invention may further include an operation for generating a notification signal for a unit cell, when an abnormality in the corresponding unit cell is detected.

Figure 7:
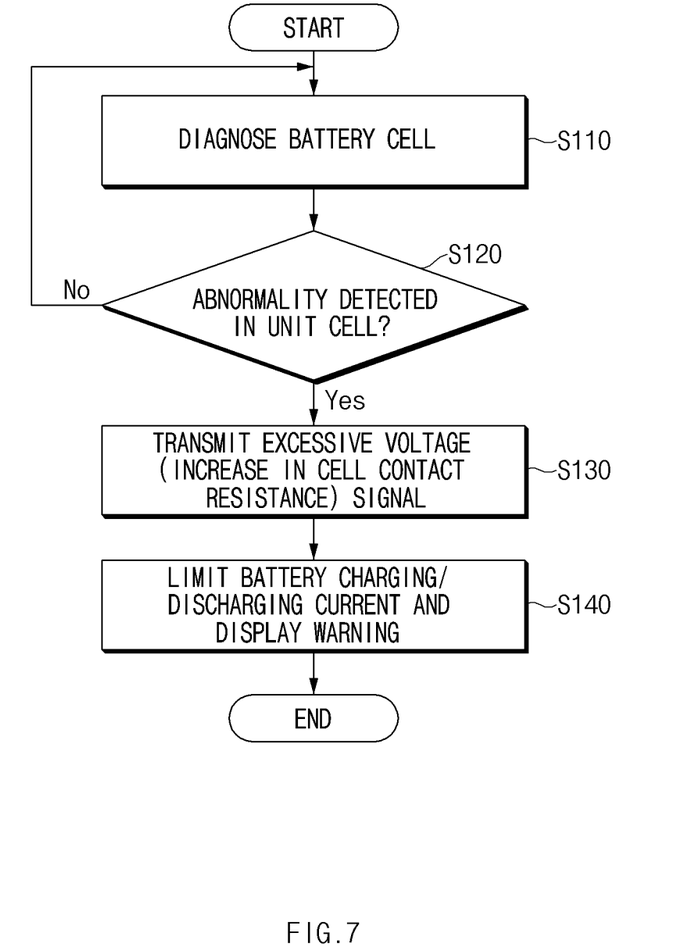
FIG. 7 is a flowchart representing a battery cell diagnosis processing method according to an embodiment of the present invention.

As an embodiment, the procedure of the battery cell diagnostic processing method will be described with reference to FIG. 7. FIG. 7 is a flowchart showing a battery cell diagnostic processing method according to an embodiment of the present invention.

First, the battery cell of the battery pack is monitored (operation S110). For example, as shown in FIG. 6, whether there is an abnormality is determined for all the unit cells of the battery pack through operations S10 to S40. Then, it is determined whether the abnormality is detected in at least one among the plurality of unit cells of the battery pack (operation S120). In operation S120, when the abnormality of the unit cell is not detected (No), the procedure moves to operation S110 again and the battery cell is diagnosed. In operation S120, when the abnormality is detected in the unit cell (Yes), the detection unit generates a excessive voltage signal (namely, a cell contact resistance increase signal or a cell lead unit resistance increase signal) as a notification signal for the unit cell from which the abnormality is detected, and transmits the notification signal to the upper layer controller (e.g., an MCU of the battery management system) or a preset manager's terminal (operation S130). Then, the battery charging/discharging current is limited by the upper layer controller (e.g., the battery management system, etc.), and a warning signal is displayed through a separate output unit (operation S150).

Accordingly, the occurrence of the abnormality due to the increase in resistance of the unit cell may be rapidly treated and an additional accident may be prevented in advance.

Furthermore, the present invention may be implemented with a battery pack. The battery pack according to an embodiment of the present invention may be configured to include: a battery module including at least a plurality of unit cells connected in series; and a battery management system for controlling charging and discharging of the battery module, wherein the battery management system includes: a voltage measurement unit which measure a voltage between both ends of each of the unit cells; a current measurement unit which measures a current of the battery module; and a detection unit which compares a first voltage measured for each of the unit cells when the battery module is in an open circuit voltage state, and a second voltage measured for each of the unit cells according to a predetermined current flowing through the battery module when the battery module is in a charging or discharging state, and detects whether the unit cell is abnormal. In this way, according to the present invention, the resistance in the lead unit of the unit cell may be rapidly monitored upon charging and discharging, and thus the stability of the battery may be raised.

Figure 8:
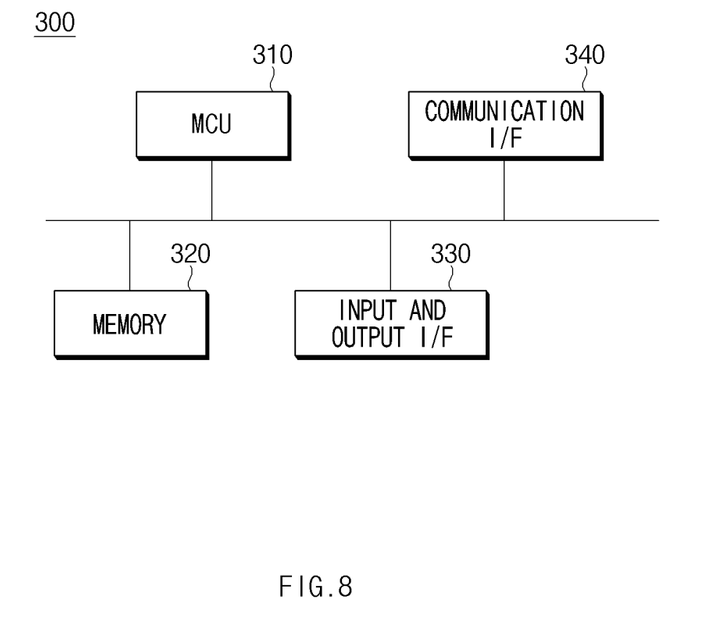
FIG. 8 is a block diagram representing a hardware configuration of a battery management system (BMS) according to an embodiment of the present invention.

On the other hand, the battery management system BMS of the battery pack according to the present invention may be represented as in FIG. 8. FIG. 8 is a block diagram representing a hardware configuration of a battery management system (BMS) according to an embodiment of the present invention.

As illustrated in FIG. 8, the battery management system 300 may include: a microcontroller unit (MCU) 310 for controlling various kinds of processes and each component; a memory 320 in which an operation system program, various kinds of programs (e.g., a battery pack abnormality diagnostic program, a battery pack temperature estimation program), and the like are stored; an input and output interface 330 for providing an input interface and an output interface with the battery cell module and/or switching unit (e.g., a semiconductor switching element); and a communication interface 340 communicable with the outside (e.g., an upper layer controller) through a wired or wireless communication network. In this way, a computer program according to the present invention may be recorded in the memory 320 and processed by the microcontroller 310, and thus may be implemented as modules respectively performing functional blocks illustrated in FIGS. 2 and 3.

Although the present invention has been described in conjunction with the limited embodiments and drawings, the present invention is not limited thereto. It will be appreciated that various modifications and changes can be made by those skilled in the art without departing from the scope and equivalents of the appended claims.

The invention claimed is:
1. A battery cell diagnostic device comprising:
a voltage sensor configured to measure, for each unit cell of a plurality of unit cells of a battery pack, a respective first voltage across the unit cell when the battery pack is in an open circuit voltage state, and a respective second voltage across the unit cell when the battery pack is in a charged or discharged state and a predetermined current is flowing through the battery pack;
memory configured to store the respective first voltage of each unit cell;
a current sensor configured to measure a current of the battery pack; and
a controller configured to:
compare, for each unit cell of the plurality of unit cells, the stored respective first voltage of the unit cell with the respective second voltage of the unit cell, and detect whether any unit cell of the plurality of unit cells is abnormal based on the comparisons.

2. The battery cell diagnostic device of claim 1, wherein the voltage measurement unit comprises:
a multiplexer including a plurality of measurement terminals respectively connected to leads between the unit cells and at both ends of the battery pack, and configured to output a measurement voltage from measurement terminals of both ends of one unit cell according to a preset measurement condition; and
an analog-to-digital converter (ADC) configured to convert the measurement voltage output from the multiplexer.

3. The battery cell diagnostic device of claim 2, wherein, for each unit cell of the plurality of unit cells of the battery pack, the controller is configured to determine whether a voltage difference between the respective first voltage of the unit cell and the respective second voltage of the unit cell exceeds a predetermined reference value to detect whether the unit cell is abnormal.

4. The battery cell diagnostic device of claim 3, wherein, in response to abnormality of the unit cell being detected, the controller is configured to determine that resistance equal to or greater than a predetermined reference value is present in a part of the leads of both ends of the unit cell.

5. The battery cell diagnostic device of claim 1, further comprising:
a memory configured to store at least one of the respective first voltage of the unit cell and the respective second voltage of the unit cell.

6. The battery cell diagnostic device of claim 1, wherein, in response to abnormality of the unit cell being detected, the controller is configured to generate a notification signal for the unit cell.

7. The battery cell diagnostic device of claim 1, wherein the controller is configured to determine whether the battery pack is in the open circuit voltage state or in the charged or discharged state based on the current measured by the current sensor.

8. The battery cell diagnostic device of claim 1, wherein for each unit cell of the plurality of unit cells:
the voltage sensor is configured to:
measure the respective first voltage of the unit cell once; and
measure the respective second voltage of the unit cell multiple times at different times to obtain a plurality of respective second voltages, and
the controller is configured to:
for each respective second voltage of the plurality of respective second voltages of the unit cell, compare the respective second voltage of the unit cell with the respective first voltage of the unit cell, and
detect whether the unit cell is abnormal based on the comparisons of the plurality of respective second voltages with the respective first voltage.

9. A battery cell diagnostic method comprising:
when a battery pack is in an open circuit voltage state, for each unit cell of a plurality of unit cells of the battery pack, measuring a respective first voltage across the unit cell;
storing the respective first voltage of each unit cell in memory
when the battery pack is in a charging or discharging state and a predetermined current is flowing through the battery pack, for each unit cell of the plurality of unit cells, measuring a respective second voltage across the unit cell;
comparing, for each unit cell of the plurality of unit cells, the stored respective first voltage of the unit cell and the respective second voltage of the unit cell; and
detecting whether any unit cell of the plurality of unit cells is abnormal based on the comparisons.

10. The battery cell diagnostic method of claim 9, wherein, for each unit cell of the plurality of unit cells of the battery pack, detecting whether the unit cell is abnormal includes determining that a voltage difference between the respective first voltage of the unit cell and the respective second voltage of the unit cell exceeds a predetermined reference value.

11. The battery cell diagnostic method of claim 10, further comprising, in response to abnormality of the unit cell being detected, determining that resistance equal to or greater than a predetermined reference value is present between leads at respective ends of the unit cell.

12. The battery cell diagnostic method of claim 9, further comprising:
generating a notification signal for the unit cell, in response to the abnormality of the unit cell being detected.

13. The battery cell diagnostic method of claim 9, wherein for each unit cell of the plurality of cells:
measuring the respective first voltage across the unit cell is performed once, and
measuring the respective second voltage across the unit cell is performed multiple times at different times to obtain a plurality of respective second voltages,
wherein the method comprises:
for each respective second voltage of the plurality of respective second voltages of the unit cell, comparing the respective second voltage of the unit cell with the respective first voltage of the unit cell, and
detecting whether the unit cell is abnormal based on the comparisons of the plurality of respective second voltages with the respective first voltage.

14. A battery pack comprising:
a battery module comprising at least a plurality of unit cells connected in series; and
a battery management system configured to control charging and discharging the battery module,
wherein the battery management system comprises:
a voltage sensor configured to measure, for each unit cell of a plurality of unit cells of a battery pack, a respective first voltage across the unit cell when the battery pack is in an open circuit voltage state, and a respective second voltage across the unit cell when the battery pack is in a charged or discharged state and a predetermined current is flowing through the battery pack; and
a current sensor configured to measure a current of the battery pack; and
a controller configured to:
compare, for each unit cell of the plurality of unit cells, the respective first voltage of the unit cell with the respective second voltage of the unit cell, and
detect whether any unit cell of the plurality of unit cells is abnormal based on the comparisons.

* * * * *